United States Patent
McMurtry et al.

(10) Patent No.: US 9,236,712 B2
(45) Date of Patent: Jan. 12, 2016

(54) FREQUENCY TUNEABLE LASER DEVICE

(75) Inventors: David R McMurtry, Dursley (GB); Alan J Holloway, Wotton-under-Edge (GB)

(73) Assignee: RENISHAW PLC, Wotton-Under-Edge (GB)

( * ) Notice: Subject to any disclaimer, the term of this patent is extended or adjusted under 35 U.S.C. 154(b) by 230 days.

(21) Appl. No.: 13/132,182

(22) PCT Filed: Dec. 16, 2009

(86) PCT No.: PCT/GB2009/002880
§ 371 (c)(1),
(2), (4) Date: Jun. 1, 2011

(87) PCT Pub. No.: WO2010/070272
PCT Pub. Date: Jun. 24, 2010

(65) Prior Publication Data
US 2011/0243160 A1    Oct. 6, 2011

(30) Foreign Application Priority Data
Dec. 18, 2008    (GB) .................................. 0823084.9

(51) Int. Cl.
*H01S 3/10*    (2006.01)
*H01S 5/14*    (2006.01)
(Continued)

(52) U.S. Cl.
CPC . *H01S 5/143* (2013.01); *H01S 3/08* (2013.01); *H01S 3/08004* (2013.01);
(Continued)

(58) Field of Classification Search
CPC ... H01S 3/08; H01S 3/08004; H01S 3/08059; H01S 3/0813; H01S 3/105; H01S 3/1055; H01S 3/106; H01S 5/142
See application file for complete search history.

(56) References Cited

U.S. PATENT DOCUMENTS

| 5,243,614 A | 9/1993 | Wakata et al. |
| 5,862,162 A | 1/1999 | Maeda |

(Continued)

FOREIGN PATENT DOCUMENTS

| CN | 151163 A | 7/2004 |
| CN | 101194402 A | 6/2008 |

(Continued)

OTHER PUBLICATIONS

Mar. 22, 2013 Office Action issued in U.S. Appl. No. 12/747,674.
(Continued)

*Primary Examiner* — Colleen A Matthews
*Assistant Examiner* — Sean Hagan
(74) *Attorney, Agent, or Firm* — Oliff PLC

(57) ABSTRACT

A frequency tuneable or chirped laser device is described that includes a laser cavity formed from a plurality of optical components. The optical components include a laser source for generating a beam of light, a spectral tuning element and one or more further optical components for directing the beam of light on to the spectral tuning element. At least one of the plurality of optical components is moveable in a first degree of freedom; such movement simultaneously altering the effective optical path length of the laser cavity and the tuning frequency of the spectral tuning element. The effective optical path length and the tuning frequency of the device are substantially insensitive to any movement of said at least one moveable optical component in degrees of freedom other than the first degree of freedom. This provides frequency tuning in which mode hopping is suppressed.

17 Claims, 11 Drawing Sheets

(51) Int. Cl.
| | |
|---|---|
| H01S 3/08 | (2006.01) |
| H01S 3/081 | (2006.01) |
| H01S 3/105 | (2006.01) |
| H01S 3/1055 | (2006.01) |
| H01S 3/106 | (2006.01) |

(52) U.S. Cl.
CPC .......... *H01S 3/0813* (2013.01); *H01S 3/08059* (2013.01); *H01S 3/105* (2013.01); *H01S 3/106* (2013.01); *H01S 3/1055* (2013.01); *H01S 3/1062* (2013.01)

(56) References Cited

U.S. PATENT DOCUMENTS

| | | | | |
|---|---|---|---|---|
| 5,956,355 | A | * | 9/1999 | Swanson et al. ................. 372/20 |
| 6,038,239 | A | | 3/2000 | Gabbert |
| 6,049,554 | A | | 4/2000 | Lang et al. |
| 6,252,897 | B1 | * | 6/2001 | Abe ................................. 372/20 |
| 6,463,085 | B1 | | 10/2002 | Tayebati |
| 6,526,071 | B1 | | 2/2003 | Zorabedian et al. |
| 6,940,879 | B2 | * | 9/2005 | Zhang ............................. 372/20 |
| 6,967,976 | B2 | | 11/2005 | Xie et al. |
| 7,099,358 | B1 | | 8/2006 | Chong |
| 8,514,898 | B1 | | 8/2013 | Pang |
| 2002/0136104 | A1 | | 9/2002 | Daiber |
| 2004/0109487 | A1 | | 6/2004 | Zhang |
| 2005/0008045 | A1 | | 1/2005 | Xie et al. |
| 2005/0078906 | A1 | | 4/2005 | Lunt et al. |
| 2005/0105565 | A1 | | 5/2005 | Tobiason et al. |
| 2006/0109872 | A1 | | 5/2006 | Sanders |
| 2006/0109873 | A1 | | 5/2006 | Crosson et al. |
| 2006/0203859 | A1 | * | 9/2006 | Cable et al. ...................... 372/20 |

FOREIGN PATENT DOCUMENTS

| | | |
|---|---|---|
| EP | 0 924 821 A1 | 6/1999 |
| EP | 1 220 389 A1 | 7/2002 |
| JP | A-1-233785 | 9/1989 |
| JP | U-7-43243 | 8/1995 |
| JP | A-10-133243 | 5/1998 |
| JP | A-11-293202 | 10/1999 |
| JP | A-2002-164614 | 6/2002 |
| JP | A-2006-24876 | 1/2006 |
| JP | A-2006-80384 | 3/2006 |
| JP | A-2007-27306 | 2/2007 |
| JP | A-2008-71798 | 3/2008 |
| JP | 2008-130805 A | 6/2008 |
| WO | WO 01/73905 A1 | 10/2001 |
| WO | WO 2006/079100 A2 | 7/2006 |
| WO | WO 2009/081160 A1 | 7/2009 |

OTHER PUBLICATIONS

International Patent Application No. PCT/GB2008/004253 (now U.S. Appl. No. 12/474,674).
International Search Report issued on Mar. 24, 2010 in International Patent Application No. PCT/GB2009/002880.
D. Ko et al. "Accurate frequency-tuning mechanism from a wedge prism in a single-mode tunable laser," *Applied Optics*, vol. 34, No. 6, Feb. 20, 1995, Washington, D.C., USA.
International Search Report issued on May 29, 2009 in International Patent Application No. PCT/GB2008/004253 (now U.S. Appl. No. 12/474,674).
Written Opinion of the International Searching Authority issued on May 29, 2009 in International Patent Application No. PCT/GB2008/004253 (now U.S. Appl. No. 12/474,674).
Office Action issued in European Application No. 08 865 429.8 dated Nov. 10, 2010.
May 23, 2012 Office Action issued in U.S. Appl. No. 12/747,674.
Jul. 6, 2011 Office Action issued in U.S. Appl. No. 12/747,674.
Jul. 26, 2011 Office Action issued in Chinese Patent Application No. 200880120808.6 (with partial translation).
Aug. 22, 2012 Office Action issued in Chinese Patent Application No. 200980150913.9 w/translation.
Jun. 24, 2013 Office Action issued in Chines Patent Application No. 200980150913.9 (with English translation).
Jul. 12, 2013 Office Action issued in U.S. Appl. No. 12/747,674.
Japanese Office Action issued in Japanese Patent Application No. 2011-541579 dated Feb. 12, 2014 (w/ translation).
Nov. 18, 2013 Notice of Allowance issued in U.S. Appl. No. 12/747,674.
May 22, 2014 Office Action issued in U.S. Appl. No. 12/747,674.
Dec. 2, 2014 Office Action issued in Japanese Application No. 2011-541579.
Dec. 22, 2014 Office Action issued in European Application No. 09 799 373.7.
Jun. 30, 2015 Office Action issued in Japanese Application No. 2011-541579.
Aug. 20, 2015 partial Search Report issued in GB1410003.6.
Nov. 4, 2015 Office Action issued in Chinese Application No. 200980150913.9.

\* cited by examiner

FREQUENCY TUNEABLE LASER DEVICE

BACKGROUND

The present invention relates to a frequency controllable laser device. In particular, the invention relates to a frequency controllable laser device that is capable of being modulated or chirped at a high frequency.

Frequency chirped laser devices, for use in interferometry and the like, are known. In particular, it is known to provide laser devices that implement a so-called Littrow scheme in which the laser cavity includes a diffraction grating onto which collimated light is directed. Tilting of the diffraction grating permits the frequency and cavity length of the laser to be simultaneously altered to provide the required frequency tuning without mode hopping. The Littrow arrangement has, however, the disadvantage that the diffraction grating must be rotated about a well defined pivot point. The critically stable mechanical arrangement required to provide the necessary accuracy of grating motion thus makes it difficult to obtain high frequency modulation speeds.

U.S. Pat. No. 6,049,554 describes various examples of laser cavities based on the above mentioned Littrow scheme and the similar Littman scheme. In particular, U.S. Pat. No. 6,049,554 describes in detail how the pivot point for a diffraction grating or mirror can be mathematically derived to provide the synchronous change in laser frequency and cavity length that allows the output frequency to be changed without introducing unwanted mode hopping effects.

SUMMARY

According to a first aspect of the present invention, there is provided a frequency tuneable laser device comprising a laser cavity formed from a plurality of optical components, the plurality of optical components comprising a laser source for generating a beam of light, a spectral tuning element and one or more further optical components for directing the beam of light on to the spectral tuning element, wherein at least one of the plurality of optical components is moveable in a first degree of freedom and such movement of said at least one moveable optical component in the first degree of freedom simultaneously alters the effective optical path length of the laser cavity and the tuning frequency of the spectral tuning element thereby providing frequency tuning in which mode hopping is suppressed, characterised in that the effective optical path length and the tuning frequency are substantially insensitive to any movement of said at least one moveable optical component in degrees of freedom other than the first degree of freedom.

The present invention thus provides a frequency controllable or tuneable laser device in which a resonant or laser cavity is formed from a plurality of optical components that include a laser source (e.g. a laser diode), a spectral tuning element (e.g. a diffractive optical element and/or an etalon) and one or more further optical components (e.g. lenses, glass blocks, band-pass filters, mirrors etc). At least one of the plurality of optical components is moveable in a first degree of freedom; for example, such a moveable optical component may be translatable along a linear axis or rotatable about an axis. Motion of the moveable optical component(s) in the first degree(s) of freedom is arranged to simultaneously alter both the effective optical path length of the laser cavity and the tuning frequency of the spectral tuning element in a manner that provides frequency tuning without mode hopping.

The present inventors have recognised that a disadvantage of known frequency tuneable lasers based on the Littrow and Littman schemes is that the pivoting motion of the moving component (e.g. the diffraction grating or the back-reflector that controls the angle of incidence of light onto the diffraction grating) must be very precisely controlled. Any motion of the pivot point that causes uncontrollable tilting or translation of the moving component results in the cavity length and tuning frequency varying out of synchronisation; this can result in unwanted mode hopping effects occurring during tuning. In prior art devices, the point about which the moving component pivots is thus controlled using high accuracy (hence relatively high cost) motion control arrangements. The lifetime of such motion control apparatus can also be somewhat limited.

Unlike prior art devices, the laser device of the present invention is arranged so that the effective optical path length and the tuning frequency are substantially insensitive to any small movement of said at least one moveable optical component in degrees of freedom other than the first degree of freedom. In other words, the required simultaneous path length and frequency tuning changes arise predominantly from movement of an optical component in one (i.e. a first) degree of freedom and are tolerant of any movement in other degrees of freedom. This has the advantage that the motion control is only required in the first degree of freedom and that uncontrolled motion in other degrees of freedom can be tolerated. The present invention thus offers the ability to use lower complexity (e.g. cheaper) motion control apparatus and/or to drive motion control apparatus at a higher speed.

The inventors, after recognising the above problem and finding the above defined solution, have devised a number of specific optical arrangements in which control over one degree of freedom of a moveable optical component(s) can be used to control both the effective cavity length and the frequency tuning provided by the spectral tuning element. For example, the embodiments described in detail below with reference to FIGS. 2 to 5 relate to a system in which the first degree of freedom of a beam steering mirror comprises linear translation along an axis and in which motion of the mirror in other degrees of freedom (e.g. tilting, translation along other axes etc) has no substantial effect on the simultaneous change in effective cavity length and frequency tuning that is imparted by the linear movement of the beam steering minor. This provides a reduction in the required motion control complexity and a corresponding reduction in device cost.

It is important to note that defining the motion of a body in certain degrees of freedom is well known in mechanics. In particular, the motion of an object relative to a static point or another body (e.g. the motion of an optical component relative to the housing of the device or a certain fixed point in space) can be described in terms of the object's degrees of freedom. In three dimensions, an unconstrained object can move in six degrees of freedom. These six degrees of freedom include three translational degrees of freedom (i.e. the object can move along three mutually orthogonal linear axes) and three rotational degrees of freedom (i.e. the object can pitch, roll and yaw). In the prior art Littrow and Littman schemes it is necessary to control motion of the moveable optical component in all six degrees of freedom by providing a highly constrained pivoting arrangement. In contrast, the present invention requires that control is provided in only a first degree of freedom because motion in the other degrees of freedom has a small, insubstantial or negligible effect on the change in effective cavity length and frequency tuning that arise from movement in the first degree of freedom.

Advantageously, the laser device comprises an actuator for controlling movement of said at least one moveable optical component in the first degree of freedom. The actuator may provide limited or no control over movement of the at least one moveable optical component in other degrees of freedom. A number of different actuators may be used. For example, the actuator may comprise one or more piezo-electric elements to impart linear motion to a moveable optical component and/or a motor for rotating a moveable optical component. The actuator system is preferable simple, reliable and robust. For example, the actuator conveniently comprises a flexure mechanism. Although flexure mechanisms typically provide relatively poor motion control, this can be tolerated in the device of the present invention. Flexure mechanisms also have the advantage of being compact and highly reliable. The actuator may also comprise a balanced oscillatory mechanical system or tuning fork arrangement as described in more detail below.

Preferably, the actuator allows rapid (e.g. oscillatory or rotary) movement of said at least one moveable optical component. Conveniently, such movement allows frequency modulation of the laser output to occur at a repetition rate greater than 5 Hz, more preferably greater than 10 Hz, more preferably greater than 50 Hz, more preferably greater than 100 Hz, more preferably greater than 200 Hz, more preferably greater than 500 Hz and more preferably greater than 1 KHz. The present invention facilitates such high repetition rates because it is only necessary to control movement of the at least one moveable optical component in the first degree of freedom; uncontrolled motion of the moveable optical component in other degrees of freedom that may occur as the repetition rate is increased have a minimal effect on the effective cavity length change and associated tuning frequency. Such repetition rates are much greater than prior art Littman or Littrow schemes in which a 1 Hz repetition rate is challenging to achieve.

Conveniently, the one or more further optical components comprise one or more moveable beam steering elements. The one or more moveable beam steering elements may be reflective (e.g. they may comprise a moveable mirror) and/or transmissive (e.g. they may comprise a lens, glass plate etc). Each moveable beam steering element is preferably moveable in a first degree of freedom; for example, an actuator may drive each moveable beam steering element in the first degree of freedom. The first degree of freedom of movement of said at least one moveable optical component may be translation along a linear axis or rotation about an axis. It should be noted that if more than one moveable beam steering element is provided, the first degree of freedom of motion may be different for different moveable beam steering elements. Advantageously, movement of the one or more moveable beam steering elements in the first degree of freedom alters the angle of incidence of the beam of light on to the spectral tuning element. Movement of the one or more moveable beam steering elements in the first degree of freedom also alters the effective path length of the laser cavity; this may be achieved by increasing the physical length of the beam path and/or by altering the refractive index along the beam path (e.g. by changing the angle of incidence of the beam of light onto a optical component such as a glass plate).

Advantageously, the one or more moveable beam steering elements comprise a first moveable beam steering element that is moveable in the first degree of freedom. Motion of the first moveable beam steering element alone preferably provides the simultaneous alteration of the effective optical path length and the tuning frequency. In such an example, the first moveable beam steering element may be the only moving part or moveable optical component within the laser device. As described below, the first moveable beam steering element may be a linearly translatable mirror or a transmissive (e.g. glass) plate that is rotatable in the beam of light.

The one or more further optical components of the laser device preferably comprise at least one lens. If a first moveable beam steering element is provided, the first moveable beam steering element is advantageously located within the focal depth (e.g. at or near the focal point) of said at least one lens. Conveniently, the one or more further optical components of the laser device comprise a pair of lenses. The beam steering element may then be located between the pair of lenses, preferably within the focal depth (e.g. substantially at or near the focal point or focus) of each lens. Focussing a beam of light onto a beam steering element, rather than directing a collimated light beam onto a beam steering element, has the advantage of further reducing the effect of uncontrolled motion of the beam steering element in degrees of freedom other than the first degree of freedom.

The one or more moveable beam steering elements may be reflective beam steering elements. Advantageously, each of the one or more moveable beam steering elements comprises a moveable mirror. Conveniently, the beam of light is incident on the moveable mirror of each of the one or more moveable beam steering elements at an oblique angle (i.e. from a direction not parallel to the surface normal of the mirror). For example, light may be directed onto each moveable mirror at an angle of 45° from the surface normal of the mirror such that the incident and reflected light beams are substantially orthogonal to one another. The angle of incidence of the light onto such a moveable mirror can be selected so as to provide the required simultaneous change in effective optical path length and tuning frequency that allow frequency tuning without mode hopping.

If a reflective moveable beam steering element is provided, the first degree of freedom of movement of the moveable mirror preferably comprises translation of the moveable mirror along a linear axis. Preferably, the linear axis of movement of the moveable mirror is parallel to the surface normal of the mirror. Such linear motion may be provided, for example, by an actuator comprising a flexure and/or a piezo-electric element. Alternative, a mirror may be rotated about an axis that is non-coincident with the surface normal of mirror; this provides an effective linear translation of the mirror during rotation.

A transmissive moveable beam steering element may be provided. The transmissive beam steering element may comprise a plate or lens having a refractive index that is different to air. For example, a glass plate or lens may be provided. Preferably, the first degree of freedom of movement of each transmissive element is rotation about a rotary axes with a component primarily in the plane of the surface. Alternatively, linear translation of, for example, a transmissive lens may be the first degree of freedom.

The spectral tuning element may comprise a diffractive optical element, such as a diffraction grating. The spectral tuning element may comprise an etalon. The spectral tuning element may also comprise both a diffraction grating and an etalon. One or more of the optical components other than the spectral tuning element may be moveable. Advantageously, the spectral tuning element is substantially stationary; e.g. it has a substantially invariant location relative to the device housing or casing. Preferably, the one or more further optical components comprise one or more lenses for collimating the beam of light that is incident on the spectral tuning element. The one or more further optical components of the laser device may include an optical filter, such as a wavelength selective coating or filter. If an etalon is provided as a spectral tuning element, it would also be possible to include a diffractive element that acts as variable wavelength selective filter; this is described in more detail below.

According to a second aspect of the invention, there is provided a frequency controllable laser device, comprising; a laser source for generating a beam of light, a spectral tuning element, a moveable beam steering component for altering the angle of incidence of the beam of light onto the spectral tuning element, and at least one lens, characterised in that the moveable beam steering component is located within, the focal depth (e.g. substantially at the focus of) the at least one lens. The at least one lens may be transmissive or reflective. Preferably, movement of the moveable beam steering component simultaneously alters the effective optical path length of the laser cavity and the tuning frequency of the spectral tuning element thereby providing frequency tuning in which mode hopping is suppressed.

Preferably, the moveable beam steering component comprises a mirror that is translatable along a linear axis. Alternatively, the moveable beam steering component comprises a (e.g. tilting) transmissive component. Conveniently, the beam of light that is incident on the spectral tuning element is collimated (e.g. by at least one lens). The spectral tuning element preferably comprises an etalon and/or a diffractive optical element.

According to a third aspect of the invention, there is provided a frequency tuneable laser device, comprising; an etalon; and a laser diode for generating a beam of light incident on the etalon; wherein the etalon is held substantially stationary within the laser device and the angle of incidence of the beam of light onto the etalon is alterable, wherein the cavity length of the laser device and the pass frequency of the etalon are both changed when the angle of incidence of the beam of light onto the etalon is altered thereby substantially suppressing mode hopping of the laser device.

Advantageously, the device comprises one or more additional optical components for controlling the angle of incidence of the beam of light onto the etalon and the optical path length of the cavity, A frequency tuneable laser device is thus described herein that comprises an etalon and a laser diode for generating a beam of light incident on the etalon, wherein the angle of incidence of the beam of light onto the etalon is alterable. Preferably, altering the angle of incidence of the beam of light onto the etalon also alters the cavity length of the laser device. Conveniently, the cavity length of the laser device and the pass frequency of the etalon are both changed when the angle of incidence of the beam of light onto the etalon is altered thereby substantially suppressing mode hopping of the laser device.

Preferably, the etalon is held substantially stationary within the laser device. For example, the etalon may be fixed or immobilised relative to the housing of the frequency tuneable laser device. The laser diode may be stationary or it may be moved to alter the angle of incidence of the beam of light onto the etalon.

Advantageously, the device comprises one or more additional optical components for controlling the angle of incidence of the beam of light onto the etalon and/or the optical path length of the cavity. The one or more additional optical components may comprise one or more moveable transmissive components, such as prisms or wedges, for steering the beam of light. Advantageously, the device comprises a moveable mirror for steering the beam of light. For example, a linearly translatable mirror may be provided to alter the angle of incidence of the beam of light onto the etalon. Advantageously, a pair of (e.g. parallel) moveable mirrors (e.g. mounted to a movable housing) are provided.

Advantageously, the angle of incidence of the beam of light onto the etalon is continuously altered during operation of the device to provide the required frequency chirped output. For example, the one or more additional optical components may be rotated or oscillated rapidly to provide a frequency chirped output.

Also described herein is an etalon is provided that comprises wedged (non-parallel) inner faces. Advantageously, such an etalon may be included in the cavity of a frequency controlled laser, such as the frequency tuneable laser device described above. The inner faces of the etalon are preferably at least partially mirrored. In such an example, the etalon may be moveable relative to a light beam incident on it. Preferably, such relative motion of the etalon is linear (e.g. translation along a linear axis). Advantageously, relative motion of the etalon has a component in the direction perpendicular to the axis of propagation of the optical beam. Advantageously, the etalon may be moved relative to a stationary light beam or vice versa. The etalon may comprise at least one, or a plurality, of optical elements or substrates as required.

Preferably, the optical elements of the etalon are shaped (e.g. wedged). Preferably the shape of the optical element(s) is selected to alter the path length of the laser cavity as the etalon is moved relative to the incident light beam. Conveniently, the shape of the optical element(s) is selected to effect the round-trip optical-path length and thereby provide mode hop free laser wavelength (frequency) tuning.

Also described herein is a frequency tuneable laser device is provided that comprises a frequency selective element and a laser diode for generating a beam of light, wherein the beam of light is passed from the laser diode to the frequency selective element via at least one moveable reflective element. Advantageously, the at least one moveable reflective element comprises a mirror. Conveniently, the mirror is translatable along a linear axis. Preferably, the mirror lies within the focal range of a pair of lenses provided in the optical path. In such an arrangement, the requirement for precisely controlled pivoting motion that is present in prior art systems is thus avoided. Preferably, movement of the at least one moveable reflective element alters the angle of incidence of light on to the frequency selective element. The frequency selective element may comprise an etalon (e.g. the etalon described above), a (transmissive or reflective) optical grating, a multi-layer-coating, or any other wavelength selective component.

A frequency controllable laser device is also described herein that has a laser cavity that comprises a frequency selective element, a laser diode, and at least one moveable reflective element, wherein the at least one moveable reflective device is translatable along a linear axis. Advantageously, translation of the at least one moveable reflective device alters both the pass frequency of the frequency selective element and the cavity length.

It should be noted that when an etalon is provided in the devices described above, it is preferred that a etalon mode selection filter is also included. Such an etalon mode selection filter preferably has a pass band equal to or less than the spectral range of the etalon. This encourages single mode operation of the laser, but is not essential.

BRIEF DESCRIPTION OF THE DRAWINGS

The invention will now be described, by way of example only, with reference to the accompanying drawings in which.

DETAILED DESCRIPTION OF EMBODIMENTS

Figure 1:
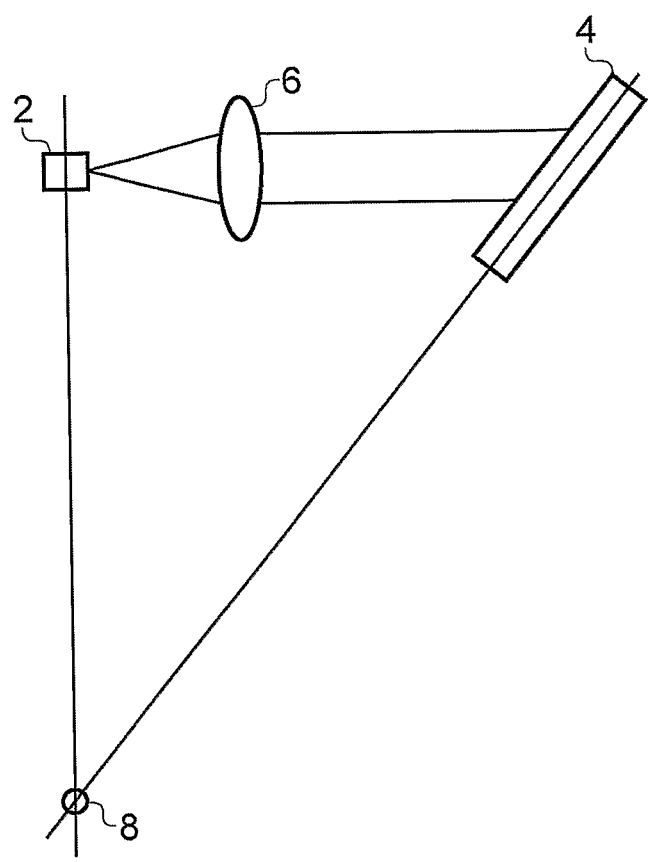
FIG. 1 shows a laser configured according to the prior art Littrow scheme.

Referring to FIG. 1, a prior art chirped laser device that implements the so-called Littrow scheme for providing an external laser cavity is illustrated. Light from a laser diode 2 is collimated onto a diffraction grating 4 by a lens 6. The diffraction grating acts as a wavelength selective element. Pivoting the diffraction grating 4 about the defined pivot point 8 allows both the pass-frequency and cavity length to be simultaneously altered thereby allowing the output frequency of the laser device to be changed without mode hopping. Pivoting the diffraction grating back and forth thus allows the frequency of light output from the cavity to be chirped.

Chirped laser devices implemented using the prior art Littrow scheme suffer from a number of disadvantages. For example, the pivoting motion of the diffraction grating 4 about the pivot point 8 must be accurately controlled. In particular, the diffraction grating must be pivoted back and forth about the pivot point 8 in the plane of the drawing without any tilting or translational movement. Any such tilting or translational movement can introduce mode hopping effects due to the laser cavity optical path length changing out of synchronisation with the spectral tuning properties of the diffraction grating. In addition, the large radius about which motion of the diffraction grating is required limits the speed at which frequency changes can be achieved thereby limiting the maximum frequency at which the device can be chirped.

The present inventors have recognised that mode hop free external cavity tuneable laser schemes require simultaneous adjustment of the laser cavity optical path length and a spectral tuning element. The wavelength $\lambda$ of the $m_c^{th}$ laser cavity mode is given by:

$$\lambda = \frac{2n_c L_c}{m_c} \quad (1)$$

where $n_c$ $L_c$ is the effective optical path through the laser cavity and $m_c$ is an integer.

If the spectral tuning element is a diffraction grating in the Littrow configuration, the wavelength of the first order diffracted back along the path of the incident beam is given by:

$$\lambda = 2n_g p_g \sin(\theta_g) \quad (2)$$

where $n_g$ is the refractive index of the medium before the grating, $P_g$ is the grating period and $\theta g$ is the angle of incidence of laser light at the grating.

If the spectral tuning element is an etalon instead of a diffraction grating, the wavelength of the $m_e^{th}$ etalon mode is given by:

$$\lambda = \frac{2n_e L_e \cos(\theta_e)}{m_e} \quad (3)$$

where $n_e$ is the refractive index of the etalon cavity, $L_e$ is the separation of the etalon mirrors, $\theta_e$ is the angle of incidence of light within the etalon and $m_e$ is an integer.

Equating expressions (1) and (2) provides the laser cavity optical path length as a function of the angle of incidence on the diffraction grating:

$$n_c L_c = m_c n_g p_g \sin(\theta_g) \quad (4)$$

Equating expressions (1) and (3) provides the laser cavity optical path length as a function of the angle of incidence on the etalon:

$$n_c L_c = \frac{m_c n_e p_e \cos(\theta_e)}{m_e} \quad (5)$$

It can be seen from equations (4) and (5) that, for a particular scheme, the necessary change in laser optical path length can be predicted for a given change in the angle of incidence on light on the tuning element (e.g. on the diffraction grating or etalon). Various schemes are thus described below that operate by changing the angle of incidence of the laser beam on an spectral tuning element (e.g. a diffractive element such as a diffraction grating or an etalon) whilst simultaneously adjusting the laser cavity optical path length nominally according to expressions (4) or (5) above.

It will now be described with reference to FIGS. 2 to 10 how a laser device may be provided in accordance with the first aspect of the present invention in which moving one of the plurality of optical components in a first degree of freedom can be used to simultaneously alter the effective optical path length of the laser cavity and the tuning frequency of the spectral tuning element in order to provide frequency tuning in which mode hopping is suppressed. In these examples, the effective optical path length and the tuning frequency are also substantially insensitive to any movement of said at least one moveable optical component in degrees of freedom other than the first degree of freedom.

Figure 2:
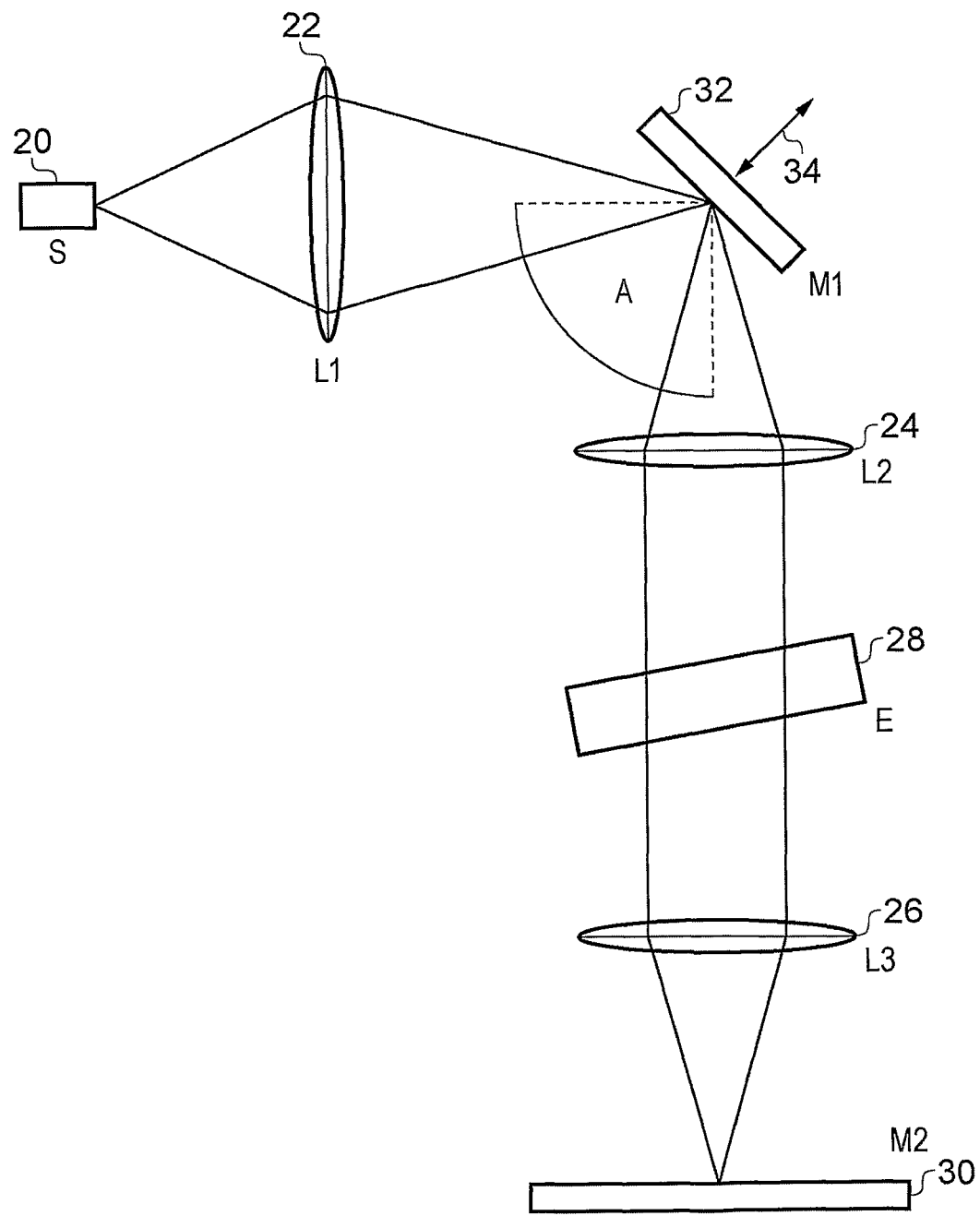
FIG. 2 shows a chirped laser device of the present invention that comprises an etalon and a linearly translatable mirror.

Referring to FIG. 2, a chirped laser device is shown. The chirped laser device comprises a laser diode 20, lenses 22, 24 and 26, an etalon 28, a static mirror 30 and a moveable mirror 32. Lenses 24 and 26 are advantageously separated by the sum of their focal lengths in order to minimise the lateral separation of the outward and return beams. The arrangement of FIG. 2 forms a resonant cavity, with the static mirror 30, moveable mirror 32 or back facet of laser diode 20 being partially transmissive to provide an output beam. Alternatively, light may be extracted from the device by including an additional beam splitter component (not shown), from a reflection from the etalon 28 or by using partially reflective mirrors 30 and 32. The front face of the laser diode 20 may be antireflection (AR) coated.

Linear translation of the moveable mirror 32 in the direction shown by the arrow 34 alters the angle of incidence of light on the etalon 28 (thereby altering the frequency of the pass band of the etalon) and simultaneously alters the path length of the cavity. Oscillating the mirror 32 back and forth thus provides the required frequency chirped output (by altering the cavity length) whilst simultaneously altering the pass frequency of the etalon to suppress mode hopping.

It is important to note that the mirror 32 is located within the focal depth of lenses 22 and 24 and therefore any other small motions (e.g. tilting) of the mirror 32 have a negligible effect; i.e. the linear position of the mirror 32 in the direction 34 is the single degree of freedom of motion that needs to be accurately controlled. The performance of the device of FIG. 2 is thus largely independent of small tilts and in-plane translations of the mirror 32. The mirror 32 can also be a relatively small and lightweight component that can thus be translated rapidly along the direction 34 thereby allowing chirping at a relatively high frequency.

A number of variants to the device shown in FIG. 2 are also envisaged by the present inventors. For example, the laser diode 20 illustrated in FIG. 2 could be replaced by an optical fibre end or any other element that outputs laser light. It should also be noted that the angle A is drawn as a right angle in FIG. 2, but it does not have to be. For the moving mirror 32, the more acute the angle A the more the optical path changes for the same change in the angle incidence on the etalon 28. A filter (not shown) is preferably included required to favour laser action on a single mode of the etalon 28; an optical coating on any of the optical surfaces could advantageously serve this purpose.

The change in laser cavity optical path change can be implemented by a normal displacement of mirror 32 along direction 34 as described above. Such a change in optical path length could also or alternatively be implemented by one or more of a lateral displacement of lens 22, a lateral displacement of lens 24 and an axial displacement of the laser diode 20. Furthermore, non-squareness of the fixed mirror 30 relative to the optic axis could be used provide some or all of the required optical path length change; this is due to motion of the point of reflection along the mirror. Similarly, a glass plate (not shown) between lens 24 and lens 26 could be provided to effect an optical path length change.

The change in the angle of light through the static etalon 28 can be implemented by a normal displacement of mirror 32 in direction 34 as described above. Such a change in angle may also or alternatively be implemented by one or more of a lateral displacement of lens 22, a lateral displacement of lens 24 and a lateral displacement of laser diode 20. If lens 22 and/or lens 24 are linearly displaced, an initial lateral offset could provide a more linear (less parabolic) response for a given lateral displacement. Similarly, the tuning of the etalon 28 can be selected to be more linear (less parabolic) with the angle of incidence of light by providing it with an initial rotation (as illustrated in FIG. 2).

Figure 3:
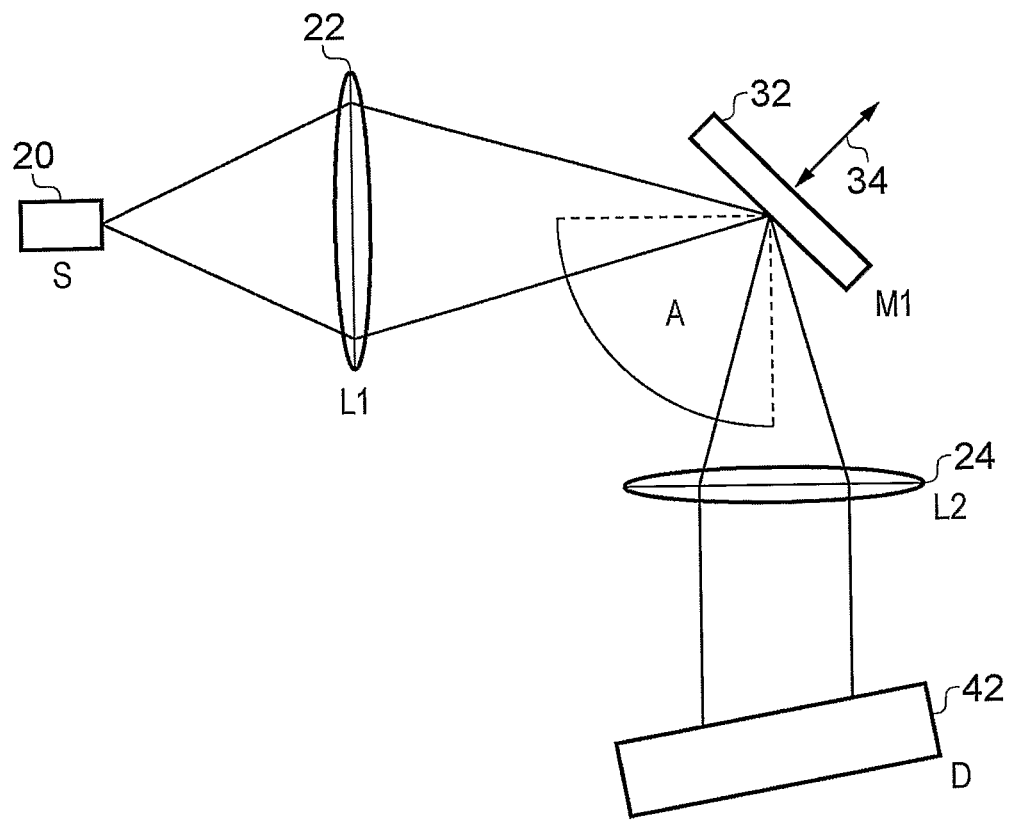
FIG. 3 shows an alternative chirped laser to that shown in FIG. 2 that comprises a diffraction grating.

Referring to FIG. 3, a variant of the chirped laser device shown in FIG. 2 is illustrated. The device comprises a diffraction grating 42 instead of the etalon 28, lens 26 and mirror 30 that are provided in the device of FIG. 2. A similar effect is thus provided using the wavelength dependent properties of the diffraction grating 42 instead of an etalon. Although a diffraction grating 42 is shown, any diffractive element with a suitably strong diffractive order could be included. For the arrangement of FIG. 3, a laser output could also be provided by a reflected or transmitted diffraction order from the diffraction grating 42.

Figure 4:
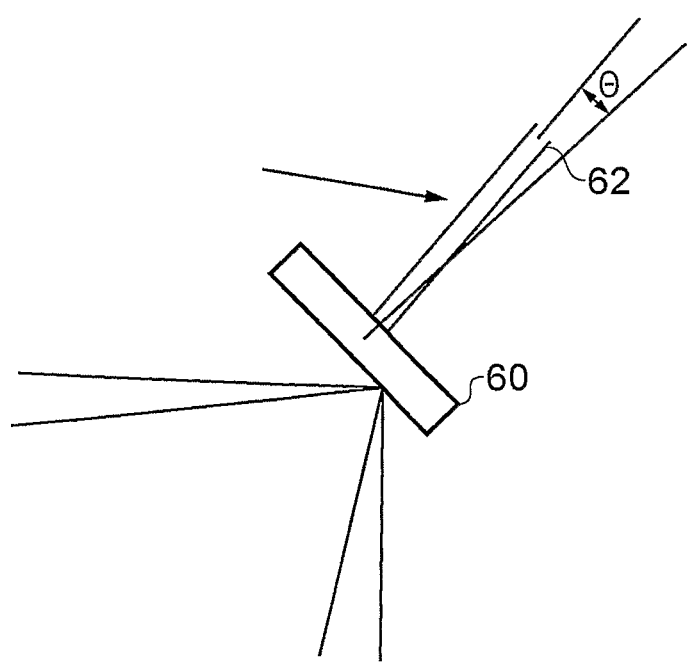
FIG. 4 shows how a mirror can be effectively linearly translated by an off-axis rotation.

Referring to FIG. 4, a different technique for moving the moveable mirrors of the systems described with reference to FIGS. 2 to 3 is shown. Instead of translating the mirror back and forth, the mirror 60 is mounted to a rotatable shaft 62. The plane of the surface mirror 60 is arranged to be non-perpendicular to the axis of the rotation of the shaft 62. In other words, the angle $\theta$ shown in FIG. 4 is more than $0°$; this angle is set to give the desired magnitude of linear displacement of the mirror at a certain mirror radius.

Figure 5:
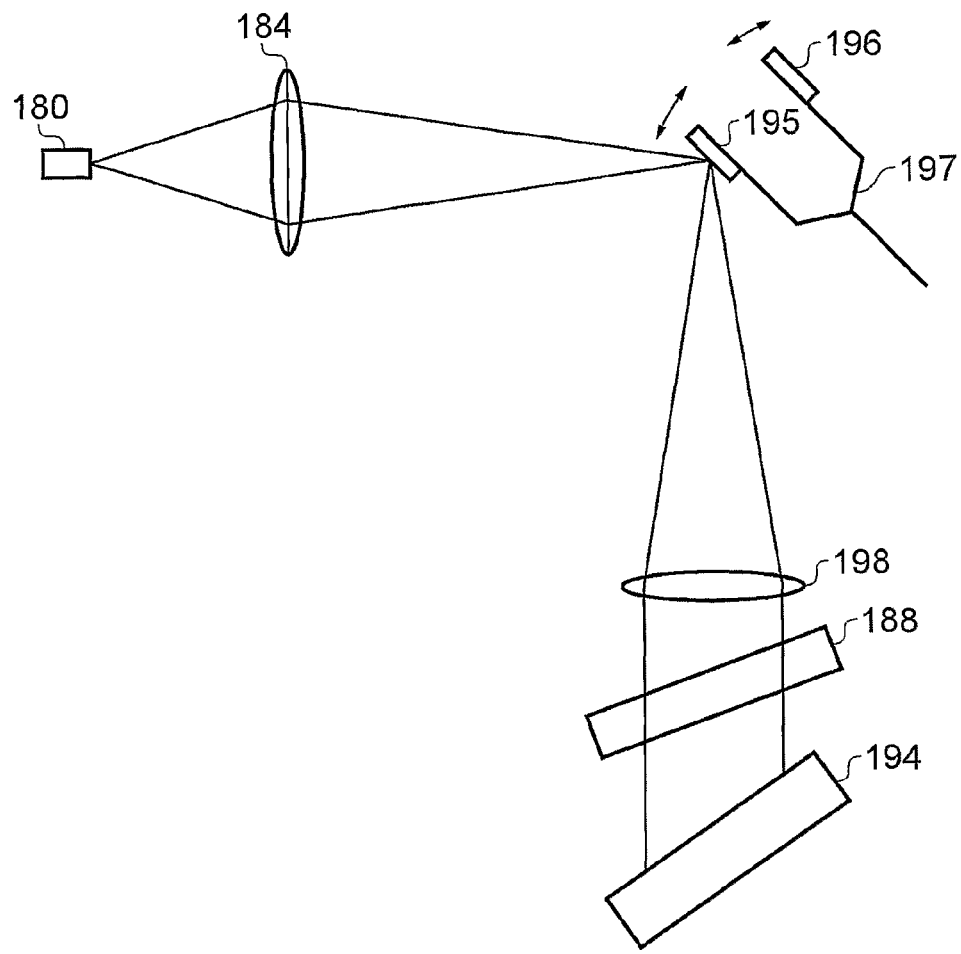
FIG. 5 shows a balanced oscillatory mechanism for moving a mirror.

Referring to FIG. 5, a further technique for moving the moveable mirror of the systems described with reference to FIGS. 2 to 3 is shown. Light from laser source 180 is focussed onto a first mirror 195 by lens 184. The first mirror 195 and a second mirror 196 are mounted to an oscillatory member 197. The member 197 can be driven to resonate so as to move the first and second mirrors 195 and 196 towards and away from one another in synchronisation. A reflective face of the first mirror 195 is located in the optical path such that oscillation of the first mirror 195 alters both the beam direction through the etalon 188 and the effective optical path length of the cavity. The second mirror 196 is provided purely as a mechanical counterbalance and therefore could therefore be replaced by a non-optical component or counterweight. A second lens 198 is also included within the optical path of the laser cavity along with a mirror 194.

Figure 6:
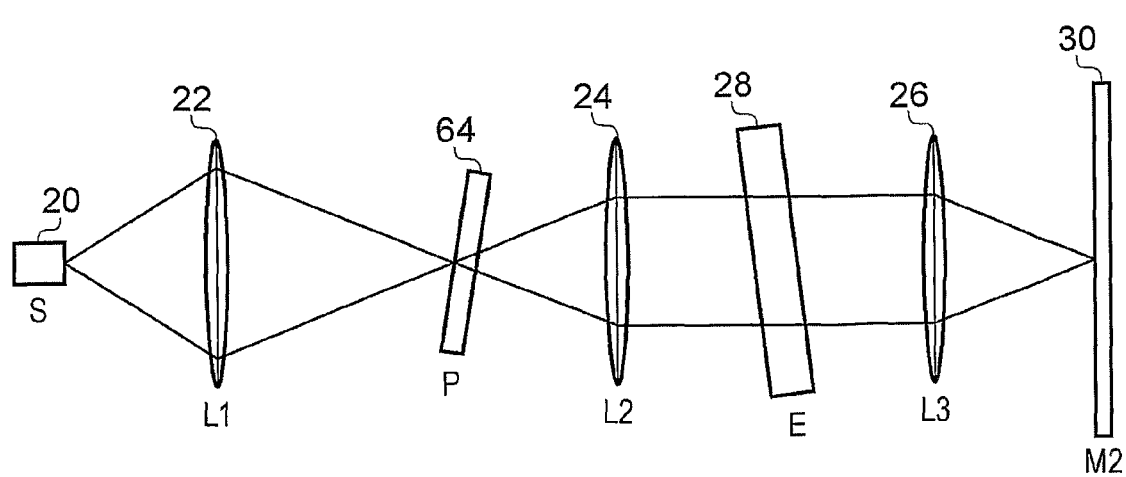
FIG. 6 shows an alternative chirped laser that comprises an etalon and a moveable glass plate.

Referring to FIG. 6, a transmissive variant of the reflective arrangements of FIGS. 2 to 5 is illustrated. In place of the moveable mirror 32 that is shown in FIG. 2, the arrangement of FIG. 6 includes a tiltable glass transmission plate 64 located near the focus of the optical beam. The change in the angle of light through the etalon 28 can be affected by rotation of the plate 64 about an axis substantially normal to the plane of the diagram. Such a rotation can also provide the required path length change; this may arise from changes in the effective path length through the plate 64 itself and/or from changes in the angle or position of the light beam incident on other optical components (e.g. the etalon 28) due to the steering effect of the plate 64. In this manner, rotational motion of the glass plate 64 about an axis can control both the path length and wavelength selective properties of the etalon. The system is thus largely independent of small translations of the glass plate 64 and tilts about the surface normal. Tilts about the other in-plane axis are largely parabolic and thus ineffective on the system.

It should be noted that the effect of tilting the glass plate 64 can be selected to be more linear (less parabolic) by providing it with an initial rotation relative to the normal to the optical axis (as illustrated in the diagram). Furthermore, one or more additional optical components (not shown) may be included to correct for any astigmatism introduced by the glass plate 64.

Figure 7:
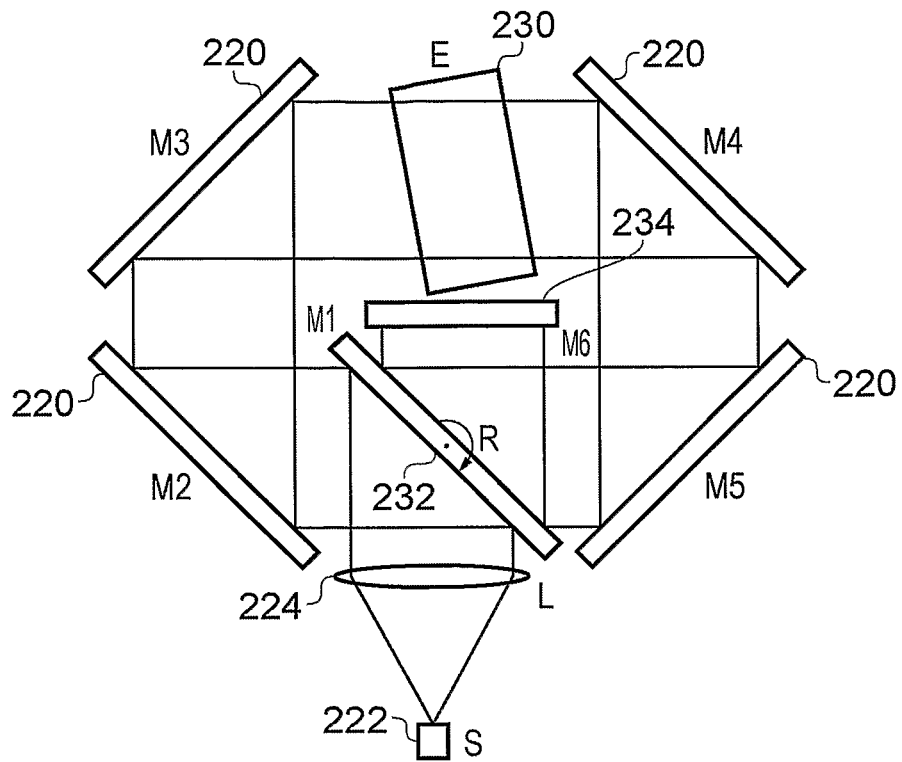
FIG. 7 shows a folded beam path laser device incorporating a mirror that is rotatable about an axis.

FIG. 7 illustrates a further embodiment in the form of a ring type laser cavity in which four static mirrors 220 are arranged to provide a folded optical path. A laser source 222 and lens 224 direct light onto a first surface of a rotatable mirror 232. Light reflected from the first surface of the mirror 232 follows a clockwise path around the four mirrors 220 before reflecting from the second surface of the mirror 232 (or from the rear face of the first surface of the mirror 232) and thereafter passing to the return mirror 234. Light reflected from the return mirror 234 returns back along the optical path in an anti-clockwise direction to the laser source 222. An etalon 230 is placed in the optical path.

The rotatable mirror 232 is arranged to rotate in one degree of freedom about an axis (e.g. axis R shown in FIG. 7) that is essentially perpendicular to its surface normal. The angle of the beam passing through the etalon 230 thus changes with rotation of the mirror 232 but, due to the reflection from the second surface of the mirror 232, the angle of incidence onto the return mirror 234 is unchanged. In the present example, the rotatable mirror 232 has a pair of parallel reflective faces; this is advantageous because any translation of the mirror 232 does not then affect the system. Rotations about the surface normal of the rotatable mirror 232 have no effect and rotation about other axes have small parabolic sensitivity. The cavity optical path thus changes in conjunction with the angle of incidence of light on the etalon 230 as the mirror 232 rotates. An additional path length change can be provided by allowing beam propagation within the mirror 232 or by including a stationary component such as a glass plate (not shown) before the return mirror 234.

Any of the static surfaces (e.g. mirrors 220) could be a diffractive element (e.g. a grating) to select a single mode from etalon 230 and thus extend the tuning range of the system. The moving surfaces of the mirror 232 could equally be diffractive if the resulting sensitivity to component translation could be tolerated. In any system, pairs of diffractive surfaces could be used to stabilise the beam angle against environmental effects such as substrate expansion and variations in refractive index etc. The example shown in FIG. 7 includes an optical path change that is symmetrical with clockwise or anticlockwise rotations of the mirror 232. It would also be possible to nominally offset the symmetry of the cavity in order to achieve improved linearity of optical path change with rotation of the mirror 232.

It should be noted that a skilled person would appreciate the various alternative ring type arrangements that could be implemented instead of that illustrated in FIG. 7. For example, more or fewer static mirrors 220 could be provided. Preferably, at least three mirrors are included.

Figure 8:
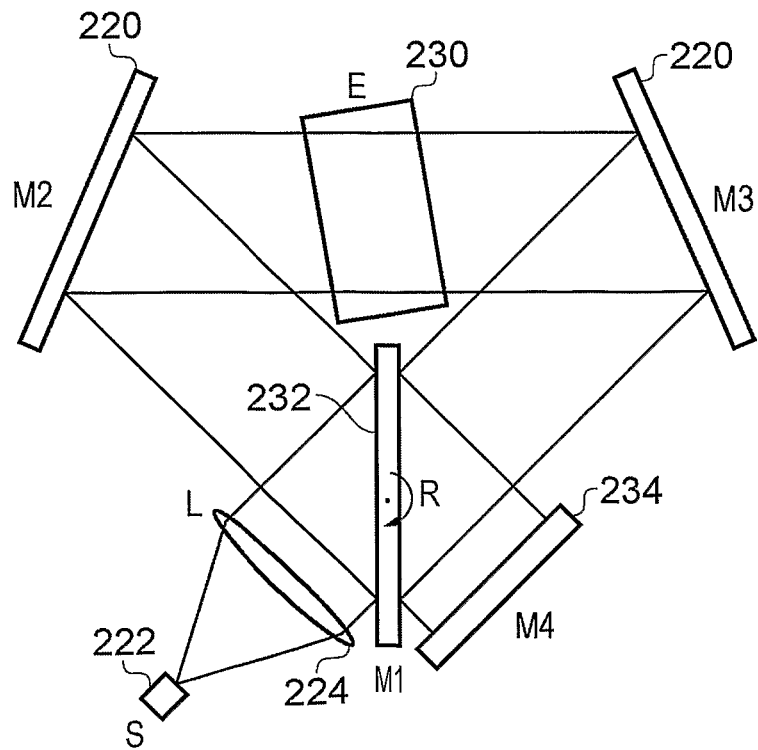
FIG. 8 shows a laser device having an alternative folded beam configuration.

FIG. 8 illustrates a variant of the system shown in FIG. 7 that includes two static mirrors 220 and a static return mirror 234. In this arrangement, the laser beam reflects from the mirror 232 and follows a clockwise path before reflecting a second time from the rear face of mirror 232 and returning from return mirror 234. Rotation of the rotatable mirror 232 about rotation axis R is again used to alter the cavity optical path length in conjunction with changing the angle of incidence of light on the etalon.

Figure 9:
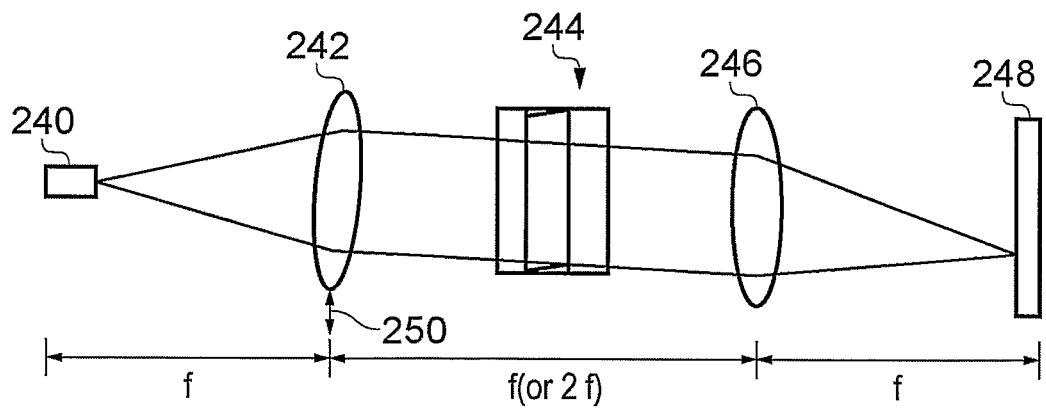
FIG. 9 shows a chirped laser comprising a linearly translatable lens.

FIG. 9 shows a yet further embodiment of the invention. A laser source 240 passes light though a first lens 242, a stationary etalon 244 and a second lens 246. Light is back-reflected by a mirror 248 to form a resonant cavity. The lens 242 is moveable. For example, it may be linearly translated in the direction shown by arrow 250. In fact, any movement of the lens 242 that has a component in the direction of the arrow 250 is sufficient. Motion of the lens not along the linear axis shown by arrow 250 (i.e. not in the single degree of freedom) has a negligible effect on the frequency tuning and cavity length change. Moving the lens in this single linear degree of freedom can be used to alter the angle of incidence of light onto the etalon 244 (thereby changing the band-pass frequency) and will also alter the path length of the cavity. Rapidly moving the lens back and forth can thus provide the required frequency chirping effect. Motion of other components of the system (e.g. second lens 246 or laser source 240) may provide a similar effect.

Figure 10:
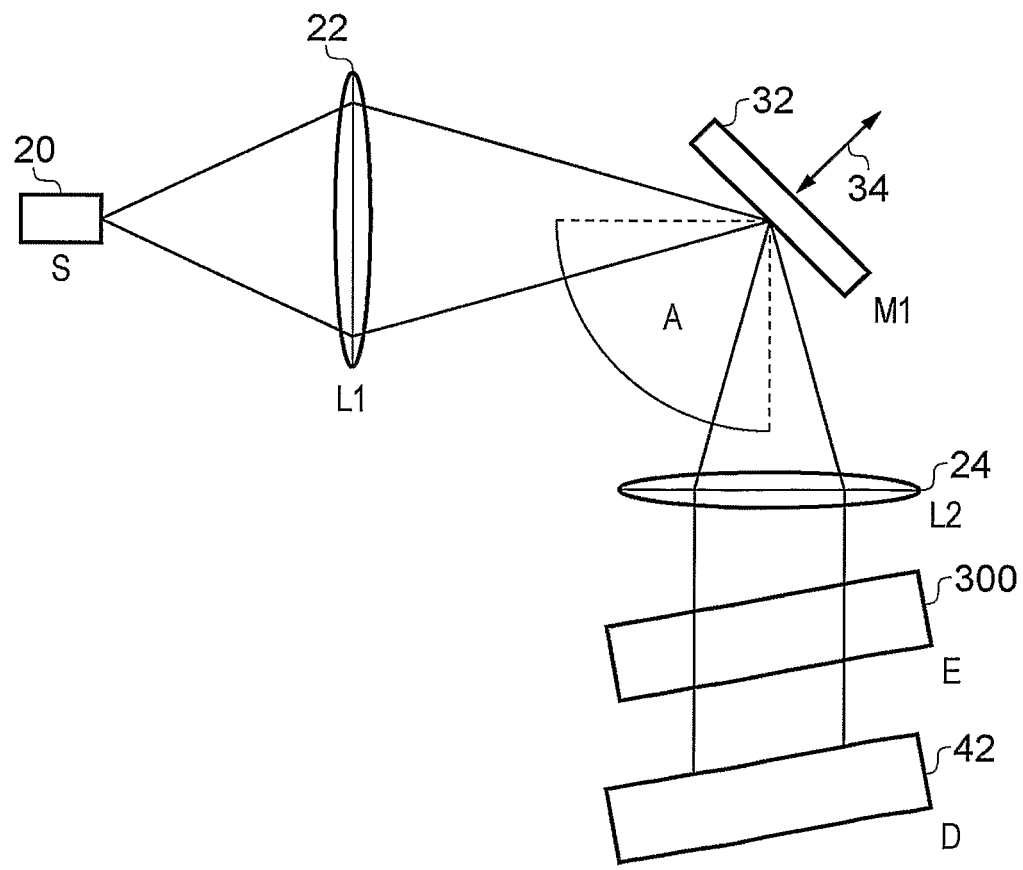
FIG. 10 shows a chirped laser device comprising an etalon and a diffraction grating.

FIG. 10 illustrates a variant of the system described with reference to FIG. 3. The laser cavity again comprises a laser source 20, a first lens 22, a linearly translatable mirror 32, a second lens 24 and a diffraction grating 42. Also included is an etalon 300 placed in the optical path between the second lens 24 and the diffraction grating 42. Although not shown, the etalon 300 and diffraction grating 42 could be combined to form a single component.

The addition of the etalon 300 provides improved side mode suppression of neighbouring laser cavity modes (compared to using the diffraction grating 42 alone) whilst the diffraction grating 42 provides side mode suppression of the neighbouring etalon cavity modes to ensure single mode operation. The key advantage of such a scheme is that the filter curve of the diffraction grating 42 is angle of incident dependent and can be made to move with the lasing mode selected by etalon 300. In this configuration, the diffraction grating 42 thus effectively acts as a variable wavelength band pass filter in which the wavelength pass band varies in unison with the change in wavelength of the light that is selected by the etalon 300. As a result, tuning beyond the free spectral range (FSR) or mode separation of the etalon 300 becomes possible; this should be contrasted to a fixed wavelength filter (e.g. a multilayer coating etc) in which the mode-hop-free tuning range is necessarily limited to the FSR of the etalon.

The embodiments described above are tolerant of movement of the moveable optical component in degrees of freedom other than a single (first) degree of freedom that controls the path length and tuning frequency properties of the laser cavity. A number of these embodiments include an etalon that may be held stationary. Further embodiments will now be described in accordance which the third aspect of the invention that comprise a stationary etalon.

Figure 11:
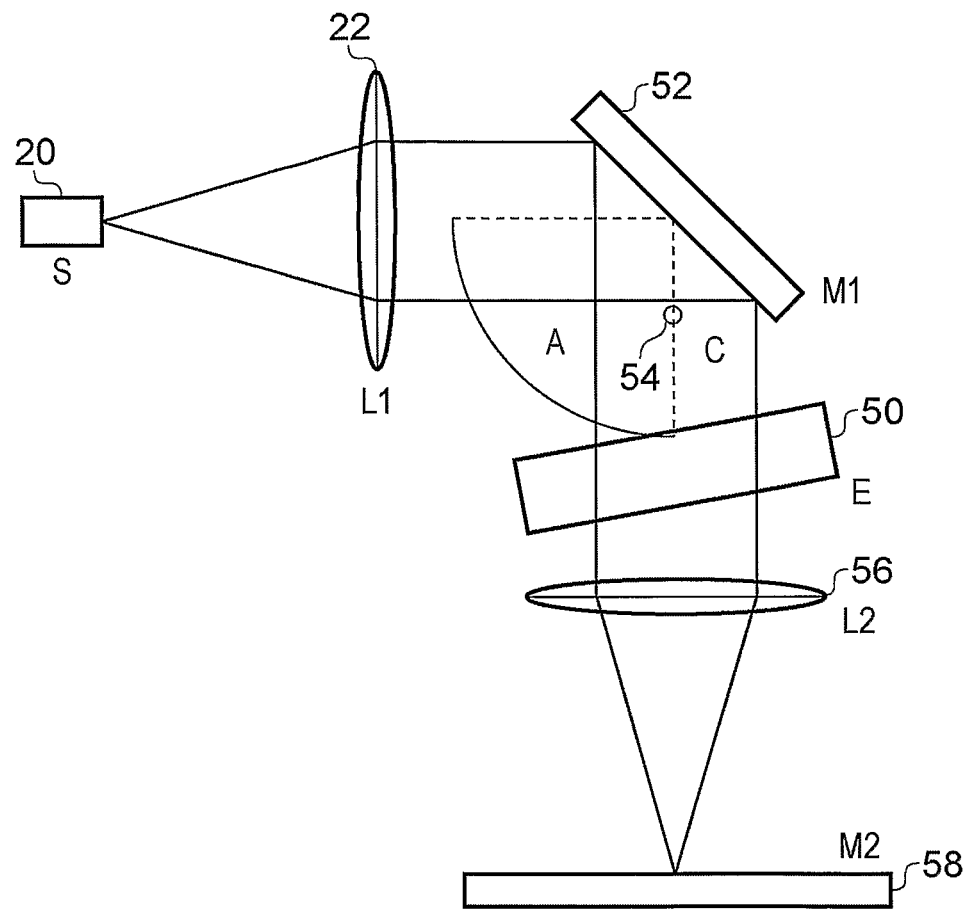
FIG. 11 shows an alternative laser arrangement comprising a static etalon.

Referring to FIG. 11, a laser device is illustrated in which light from a laser diode 20 passes through a lens 22 and reflects from a moveable mirror 52. The light reflected from the mirror passes through an etalon 50 and is focussed onto a static mirror 58 by a lens 56. The moveable mirror 52 is translated and rotated so that the centre ray of the reflected beam passes substantially though the focus 54 of the lens 56. In this manner, the cavity length and the pass frequency of the etalon can be simultaneously altered by movement of mirror 52. The moveable mirror 52 is preferably rotated about the point 54, although this is not essential. Although operable, the arrangement of FIG. 11 is more sensitive to accidental translations of the mirror 52 than the arrangements described with reference to FIG. 3.

Figure 12:
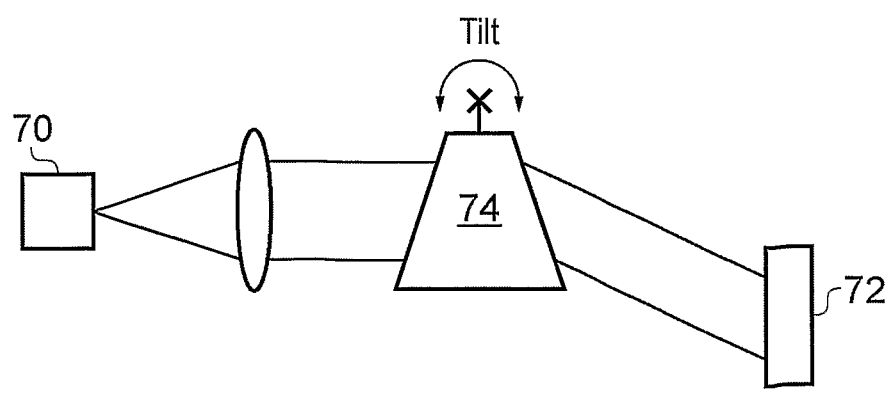
FIG. 12 shows an alternative chirped laser that comprises a stationary diffraction grating or etalon and a tillable glass prism.

Referring to FIG. 12, an alternative laser device is shown. Light from a laser diode 70 is directed to onto a spectral tuning or wavelength selective element 72 that may comprise an etalon (with a suitable lens arrangement) or a diffraction grating. A tiltable prism 74 is used to alter both the path length within the cavity and the angle of incidence of light on the wavelength selective element. In this manner, cavity length and band pass frequency can simultaneously adjusted. In place of the tiltable prism 74, it would be possible to provide a static wedge with a variable refractive index (e.g. a wedge that includes liquid crystal or has a variable internal air pressure).

Figure 13:
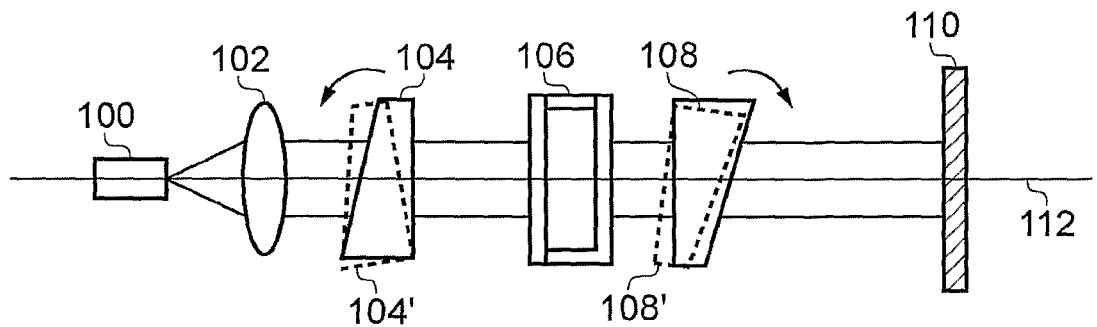
FIG. 13 shows a chirped laser that comprises a stationary etalon and a pair of tiltable glass prisms.

FIG. 13 shows a further embodiment. A laser diode 100 generates light that is passed though a lens 102, a first tiltable prism 104, a stationary etalon 106 and a second tiltable prism 108 before being back reflected by a mirror 110. In use, the first tiltable prism 104 and the second tiltable prism 108 are tilted in opposite directions (e.g. to positions 104' and 108') thereby altering the angle of incidence of light onto the etalon 106 whilst also altering the cavity length.

Figure 14:
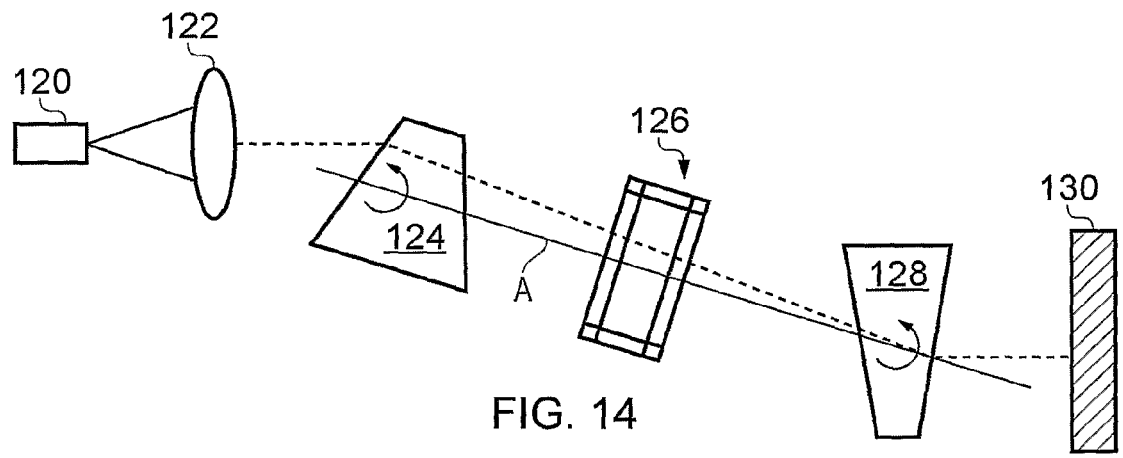
FIG. 14 shows a chirped laser that comprises a stationary etalon and a pair of glass prisms rotatable about an axis misaligned to the optical axis.

FIG. 14 shows a further embodiment. A laser source 120 directs light though a lens 122, a first rotatable prism 124, a stationary etalon 126 and a second rotatable prism 128 to a mirror 130. The first rotatable prism 124 and the second rotatable prism 128 are rotatable about a common axis A. The first rotatable prism 124 and the second rotatable prism 128 are rotated in synchronisation in the same direction; this allows both the angle through the etalon 126 and the path length to be varied. The first rotatable prism 124 and the second rotatable prism 128 may be matched. Rotation of prisms in this manner allows the frequency of the output to be chirped without mode hopping effects.

Figure 15:
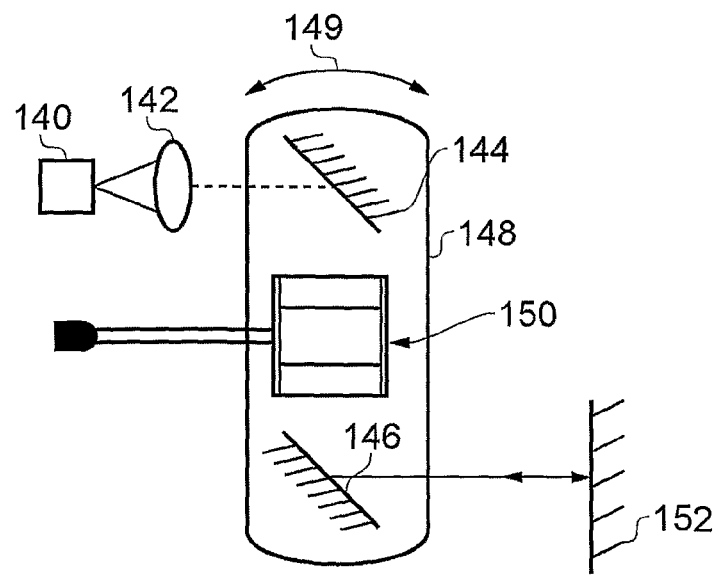
FIG. 15 shows an alternative chirped laser device comprising a pair of mirrors carried by a housing and a stationary etalon.

Referring to FIG. 15, a further chirped laser device is shown. The device comprises a laser diode 140 and lens 142. A first mirror 144 and a second mirror 146 are carried by a moveable member 148. The first mirror 144 and a second mirror 146 have a fixed position relative to one another and have inwardly facing reflective surfaces that are substantially parallel. The moveable member 148 (and hence the first and second mirrors 144 and 146) is rotatable in the direction shown by arrow 149. A stationary etalon 150 is inserted in the optical path between the first and second mirrors 144 and 146. The etalon 150 is anchored in position and is not attached to, and does not move with, the moveable member 148.

In use, light from the laser diode 140 is reflected from the first mirror 144 to the second mirror 146 via the etalon 150. This light is then directed to, and reflected from, a fixed position mirror 152 and returns to the laser diode 140 along the same optical path thus forming a resonant cavity. Rotation of the moveable member 148 can be seen to alter the angle that light passes through the etalon 150 in conjunction with changing the cavity length. Oscillating the moveable member 148 back and forth thus chirps the output frequency and suppresses mode hopping.

Figure 16:
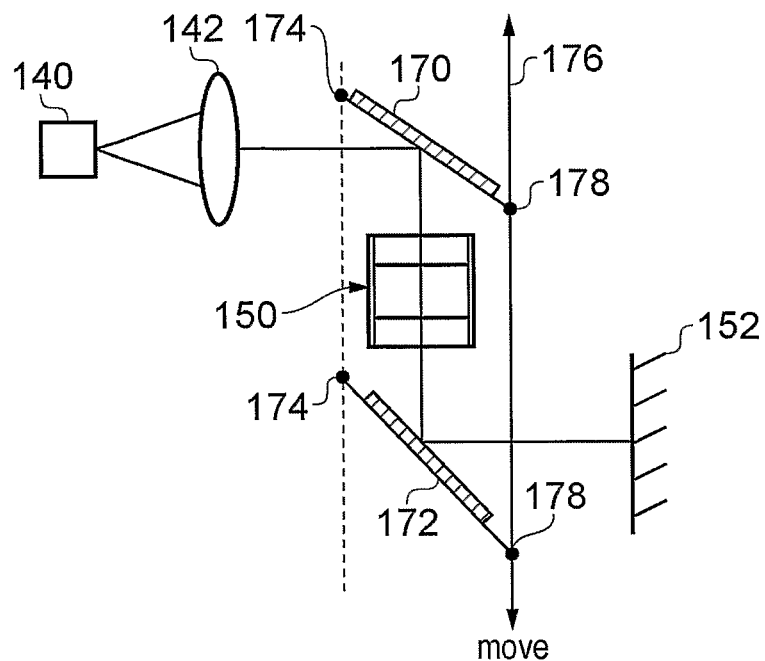
FIG. 16 shows an alternative chirped laser comprising a pair of hinged mirrors and a stationary etalon.

FIG. 16 shows a variant of the device of FIG. 15. An etalon 150 is located between a first mirror 170 and a second mirror 172. A resonant cavity is again formed with a laser diode 140, lens 142 and fixed mirror 152. Simultaneous motion of the first and second mirrors is achieved by attaching one end of each mirror to a fixed position pivot point 174. The other end of each mirror is attached to a linearly translatable member 176 via pivots 178 (which could include a flexure). Translation of the translatable member 176 (e.g. "up and down" in FIG. 11) alters the angle of the mirrors but keeps such mirror parallel. The angle of incidence of light onto the etalon 150 can thus be altered and such an alteration provides a corresponding change in cavity length. The output frequency can thus be chirped without mode hopping effects.

Figure 17:
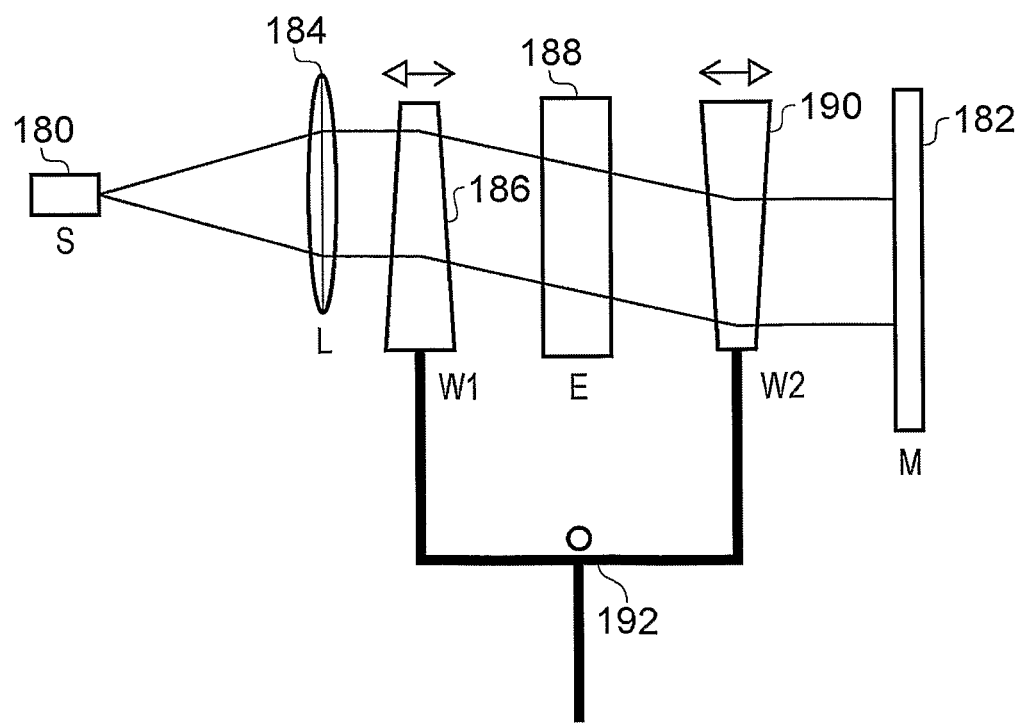
FIG. 17 shows an alternative chirped laser comprising a stationary etalon located between a pair of moveable prisms carried by a tuning fork oscillatory arrangement.

FIG. 17 shows a laser device using an oscillatory arrangement similar to that described with reference to FIG. 5 above. A laser diode 180 generates light that is passed to a mirror 182 via a lens 184, a first wedge or prism 186, an etalon 188 and a second wedge or prism 190. The first and second prisms 186 and 190 are mounted to an oscillatory member 192. The member 192 can be driven to resonate so as to move the first and second prisms 186 and 190 towards and away from the etalon 188 in synchronisation. This can be thought of as a tuning fork type of arrangement. Simultaneously tilting the first and second prisms 186 and 190 in this manner allows the angle of incidence of light on the etalon 188 to be varied in conjunction with altering the cavity length.

Figure 18:
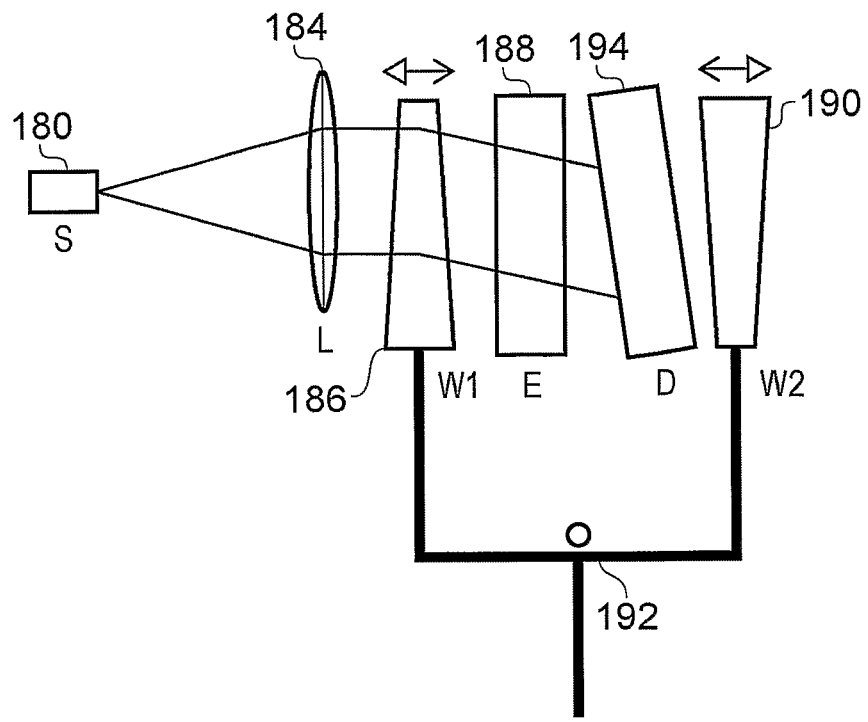
FIG. 18 shows a variant of the device of FIG. 17 comprising a diffraction grating in combination with the stationary etalon.

FIG. 18 illustrates a reflective variant of the arrangement of FIG. 17. A reflective diffractive element 194 is located between the etalon 188 and the second prism 190. The benefits of using an etalon in combination with a diffractive element are described in more above with reference to FIG. 10. In this example, the second prism 190 is provided purely for mechanical balance and could therefore be replaced by a non-optical component or counterweight.

The examples described with reference to FIGS. 5, 17 and 18 show counterbalanced, two-dimensional, oscillatory motion. Such counterbalanced motion is advantageous as it minimises mechanical disturbance to the rest of the system. It should also be noted that although the above described examples are shown in two-dimensions, balanced oscillatory mechanisms of three or more components oscillating in opposition about an axis normal to the page (for example) are equally feasible. In addition to opposed motion oscillations that provide a so-called "quite" mechanism, schemes incorporating spinning surfaces can be provided as will be described below.

Figure 19:
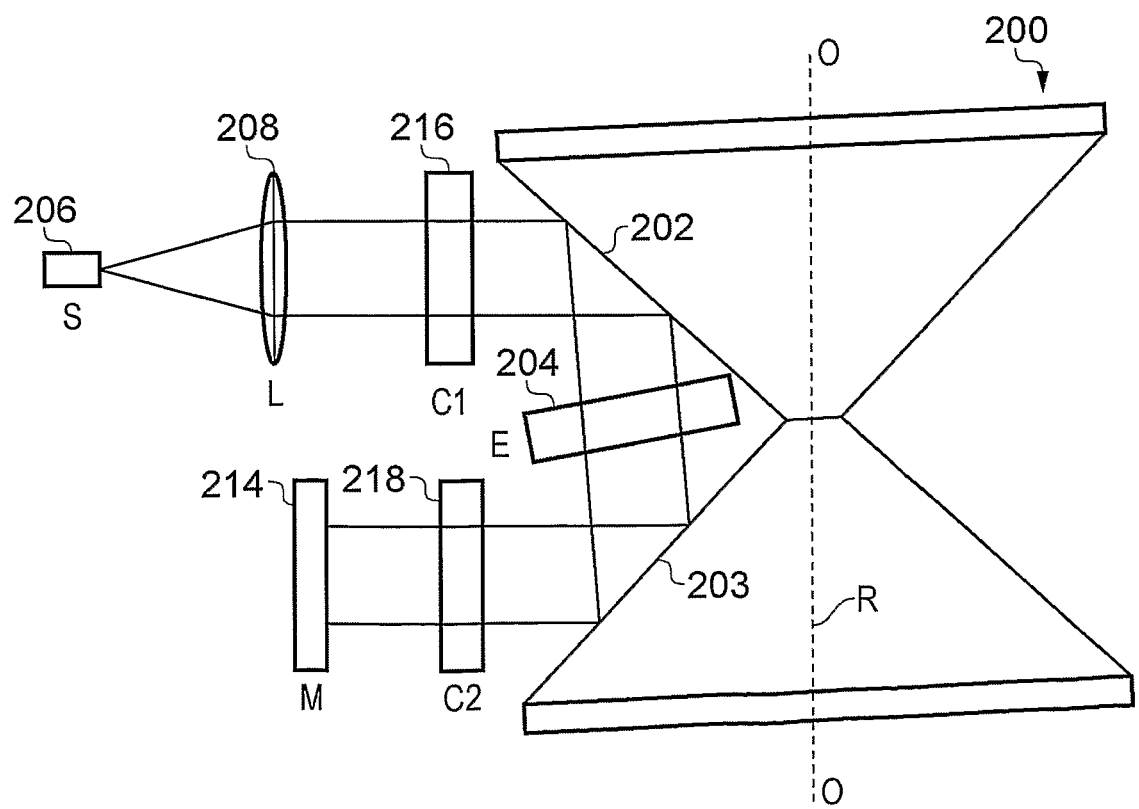
FIG. 19 shows a bobbin having a pair of reflective surfaces that control the passage of light though a stationary etalon.

FIG. 19 illustrates a further laser device. A bobbin or ring 200 is provided that has a first reflective surface 202 and a second reflective surface 203. The ring 200 is rotatable about the rotational axis R and an etalon 204 is located adjacent the ring 200. A laser diode 206 and lens 208 direct a beam of light onto the first reflective surface 202 of the ring 200 which is steered towards the second reflective surface 203 via the etalon 204. Light reflected from the second reflective surface 203 is directed to a fixed mirror 214. Back-reflected light from the mirror 214 returns to the laser diode 206 along the same optical path thereby forming a resonant cavity. Cylindrical optics 216 and 218 provide a collimated beam through the etalon 204. The rotational axis R is slightly misaligned relative to the line of symmetry of the bobbin 200 such that as the bobbin rotates, the reflective surfaces 203 and 203 wobble relative to the input laser beam thereby varying the effective path length and angle of incidence of light onto the etalon 204. The skilled person would appreciate the various alternative spinning disc and plate type schemes with internal and external reflective surfaces that would be possible.

Figure 20:
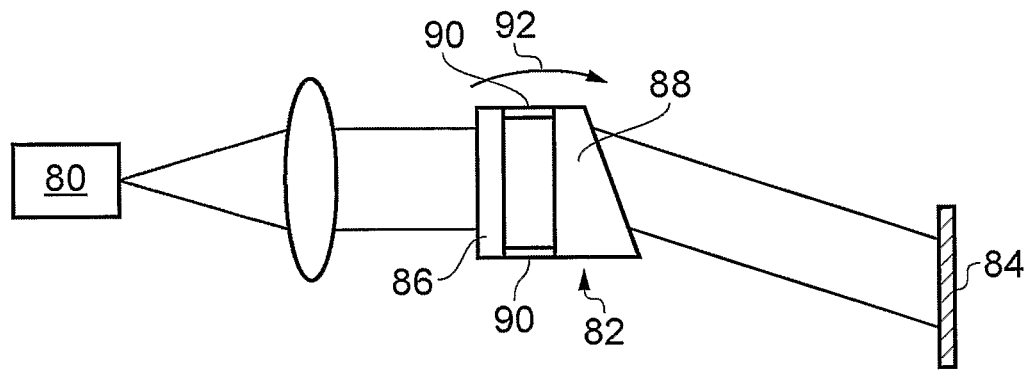
FIG. 20 shows a chirped laser having a rotatable wedged etalon.

FIG. 20 illustrates alternative laser device in which light from a laser source 80 is passed through a moveable etalon 82 to a mirror 84. The etalon 82 is formed from a first glass plate 86 and a second glass plate 88. The inner faces of the first and second glass plates are mirror coated and held substantially parallel to one another by spacer elements 90. Although a hollow cavity is shown, the cavity could be formed from glass. The second glass plate 88 is a prism with a wedge angle that steers light towards mirror 84. Rotating the etalon 82 as indicated by arrow 92 causes the angle of incidence of light onto the etalon thereby altering the pass-frequency. The same rotational movement of the etalon 82 also alters the cavity length of the device by altering the path length though the wedge of the second glass plate 88. The band pass frequency and cavity length can thus be controlled together.

Figure 21:
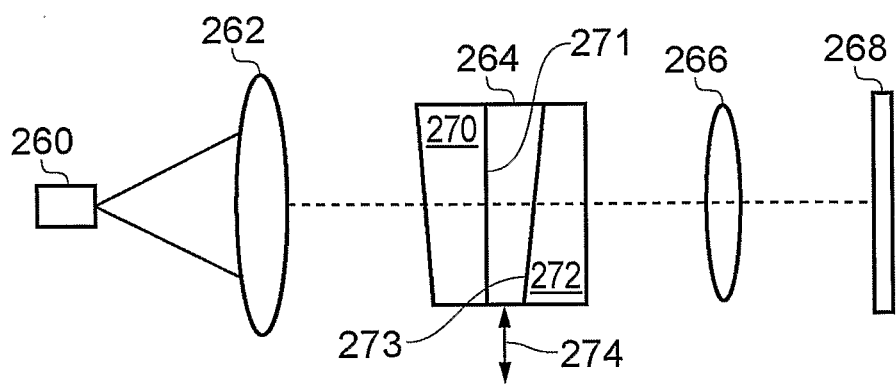
FIG. 21 shows a chirped laser having a linearly moveable wedged etalon.

Referring to FIG. 21 another laser device is shown. A laser source 260 passes light though a first lens 262, an etalon 264 and a second lens 266. Light is back-reflected by a mirror 268 to form a resonant cavity. The etalon 264 comprises a first glass plate 270 and a second glass plate 272. Unlike a standard etalon in which parallel, mirrored, internal surface are used, the mirror coated inner faces 271 and 273 of the first and second glass plates 270 and 272 are slightly angled with respect to one another; for example, the wedge angle is preferably less than λ/D where λ is the wavelength and D is the beam diameter. The outer surfaces of the first and second glass plates 270 and 272 are also preferably non-parallel to one another and are also preferably non-parallel to the inner surfaces.

The wedge angle of the mirrored inner surface of the etalon means that the pass frequency will alter along the length or change in wedge angle of the etalon. A corresponding change in path length can also be provided by appropriately selecting the outer angles of the first and second glass plates. In this manner, linear translation of the etalon 264 in the direction shown by arrow 274 has the effect of altering the pass frequency (i.e. by changing the spacing of the etalon inner surface in the light path) whilst also altering the path length. Instead of translating the etalon, appropriate beam steering elements may be provided to alter the position where the optical beam intersect the etalon. For example, the light beam could be translated using a tilted glass plate or a displaced prism.

The invention claimed is:

1. A frequency tuneable laser device comprising:
a laser cavity formed from a plurality of optical components, the plurality of optical components comprising:
a laser source that generates a beam of light,
a spectral tuning element, and
one or more further optical components that directs the beam of light on to the spectral tuning element,
wherein at least one of the plurality of optical components is a moveable optical component configured to move in a first degree of freedom, the movement of said at least one moveable optical component in the first degree of freedom simultaneously altering an effective optical path length of the laser cavity and a tuning frequency of the spectral tuning element, thereby providing frequency tuning in which mode hopping is suppressed,
wherein the effective optical path length and the tuning frequency are substantially insensitive to any movement of said at least one moveable optical component in degrees of freedom other than the first degree of freedom, and
wherein the movement of the at least one moveable optical component keeps the beam of light directed on to the spectral tuning element.

2. A laser device according to claim 1, comprising an actuator that controls movement of said at least one moveable optical component in the first degree of freedom.

3. A laser device according to claim 2, wherein the actuator allows movement of said at least one moveable optical component that provides frequency modulation at a repetition rate greater than 50 Hz.

4. A laser device according to claim 2, wherein the actuator comprises at least one of a flexure and a balanced oscillatory mechanical system.

5. A laser device according to claim 1, wherein the one or more further optical components comprise one or more moveable beam steering elements that are each configured to move in a first degree of freedom, wherein movement of the one or more moveable beam steering elements in the first degree of freedom alters an angle of incidence of the beam of light on to the spectral tuning element.

6. A laser device according to claim 5, wherein the one or more moveable beam steering elements comprise a first moveable beam steering element that is configured to move in the first degree of freedom, wherein motion of the first moveable beam steering element alone provides the simultaneous alteration of the effective optical path length and the tuning frequency.

7. A laser device according to claim 6, wherein the one or more further optical components comprise at least one lens, wherein the first moveable beam steering element is located within a focal depth of said at least one lens.

8. A laser device according to claim 6, wherein the first moveable beam steering element comprises a moveable mirror, wherein the beam of light is incident on the moveable mirror at an oblique angle.

9. A laser device according to claim 6, wherein the first moveable beam steering element comprises a transmissive element.

10. A laser device according to claim 1, wherein the first degree of freedom of movement of said at least one moveable optical component is translation along a linear axis.

11. A laser device according to claim 1, wherein the first degree of freedom of movement of said at least one moveable optical component is rotation about an axis.

12. A laser device according to claim 1, wherein the spectral tuning element is substantially stationary.

13. A laser device according to claim 1, wherein the one or more further optical components collimate the beam of light that is incident on the spectral tuning element.

14. A laser device according to claim 1, wherein the spectral tuning element comprises a diffractive optical element.

15. A laser device according to claim 1, wherein the spectral tuning element comprises an etalon.

16. A frequency tuneable laser device, comprising:
an etalon; and
a laser diode that generates a beam of light incident on the etalon;
wherein the etalon is held substantially stationary within the laser device, and an angle of incidence of the beam of light onto the etalon is alterable; and
wherein a cavity length of the laser device and a pass frequency of the etalon are both changed when the angle of incidence of the beam of light onto the etalon is altered, thereby substantially suppressing mode hopping of the laser device.

17. A device according to claim 16, comprising one or more additional optical components that controls the angle of incidence of the beam of light onto the etalon and an optical path length of the cavity.

* * * * *